United States Patent
Zhang et al.

(10) Patent No.: US 11,281,276 B2
(45) Date of Patent: Mar. 22, 2022

(54) POWER CONTROL DEVICE AND METHOD FOR ERROR CORRECTION CODE COMPONENTS IN MEMORY SYSTEM

(71) Applicant: SK hynix Inc., Gyeonggi-do (KR)

(72) Inventors: Fan Zhang, Fremont, CA (US); Hongwei Duan, Cupertino, CA (US); Aman Bhatia, Los Gatos, CA (US)

(73) Assignee: SK hynix Inc., Gyeonggi-do (KR)

( * ) Notice: Subject to any disclaimer, the term of this patent is extended or adjusted under 35 U.S.C. 154(b) by 210 days.

(21) Appl. No.: 16/797,728

(22) Filed: Feb. 21, 2020

(65) Prior Publication Data

US 2021/0263577 A1     Aug. 26, 2021

(51) Int. Cl.
| | | |
|---|---|---|
| *G06F 1/28* | (2006.01) | |
| *G06F 11/10* | (2006.01) | |
| *G06F 1/3234* | (2019.01) | |
| *G06F 12/02* | (2006.01) | |
| *G06F 1/3225* | (2019.01) | |
| *G06F 3/06* | (2006.01) | |
| *G11C 16/30* | (2006.01) | |

(52) U.S. Cl.
CPC .............. *G06F 1/28* (2013.01); *G06F 1/3275* (2013.01); *G06F 11/1076* (2013.01); *G06F 1/3225* (2013.01); *G06F 3/0679* (2013.01); *G06F 12/0238* (2013.01); *G11C 16/30* (2013.01)

(58) Field of Classification Search
CPC ........ G06F 1/28; G06F 1/3225; G06F 1/3275; G06F 11/1076; G06F 12/0238; G06F 3/0679; G11C 16/30
See application file for complete search history.

(56) References Cited

U.S. PATENT DOCUMENTS

| | | | |
|---|---|---|---|
| 9,329,933 B2 | 5/2016 | Weilemann, II et al. | |
| 10,223,199 B2 | 3/2019 | Hahn et al. | |
| 10,530,393 B2* | 1/2020 | Ryabinin | .......... H03M 13/1575 |
| 11,003,388 B2* | 5/2021 | Hasbun | ............... G06F 12/0238 |

* cited by examiner

*Primary Examiner* — Terrell S Johnson
(74) *Attorney, Agent, or Firm* — IP & T Group LLP

(57) ABSTRACT

A control of a memory system includes firmware and one error correction code (ECC) module. The module includes a power control engine and ECC components, each ECC component including a power monitor and a power controller. The firmware configures a window of time and a power consumption rate of a select ECC component depending on characteristics of the memory system. The power monitor of the select ECC component measures a power consumption of the select ECC component within the window. The power control engine receives the measurement of power consumption, decides a next power level for the select ECC component, and controls the power controller of the select ECC component such that the select ECC component operates at the next power level.

20 Claims, 9 Drawing Sheets

FIG. 6

| CUSTOMER | WINDOW SIZE(x) |
|---|---|
| A | 10μs |
| B | 1μs |
| C | 1ms |

(610)

| PRODUCT LINE | POWER CONSUMPTION RATE |
|---|---|
| SSD100 | 10% |
| SSD200 | 20% |
| SSD300 | 30% |

(620)

Separate FSM

⋮

(910)

Joint FSM (920)

POWER CONTROL DEVICE AND METHOD FOR ERROR CORRECTION CODE COMPONENTS IN MEMORY SYSTEM

BACKGROUND

1. Field

Embodiments of the present disclosure relate to a power control scheme in a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). A memory system includes a power supply (e.g., a power management integrated circuit (PMIC)), which receives power from an external and provides components of the memory system with the power.

SUMMARY

Aspects of the present invention include a power control device for a memory system including a single error correction code (ECC) module (or ECC IP) and a method thereof.

In one aspect, a memory system includes a controller, which includes firmware, a power control engine and a plurality of error correction code (ECC) components, each ECC component including a power monitor and a power controller. The firmware configures a window of time and a power consumption rate of a select ECC component among the plurality of ECC components depending on characteristics of the memory system. The power monitor of the select ECC component measures power consumption of the select ECC component within the window under the control of the power controller of the select ECC component. The power control engine receives the measurement of power consumption from the power monitor, decides a next power level for the select ECC component based on the measurement of power consumption, and controls the power controller of the select ECC component such that the select ECC component operates at the next power level.

In another aspect, a method for operating a controller of a memory system including firmware, a power control engine and a plurality of error correction code (ECC) components, each ECC component including a power monitor and a power controller. The method includes: configuring, by the firmware, a window of time and a power consumption rate of a select ECC component among the plurality of ECC components depending on characteristics of the memory system; measuring, by the power monitor of the select ECC component, a power consumption of the select ECC component within the window under the control of the power controller of the select ECC component; controlling, by the power control engine, the power controller such that the power monitor performs the measurement within the window; receiving, by the power control engine, the measurement of power consumption from the power monitor; deciding, by the power control engine, a next power level for the corresponding ECC component based on the measurement of the power consumption; and controlling, by the power control engine, the power controller such that the select ECC component operates at the next power level.

Additional aspects of the present invention will become apparent from the following description.

BRIEF DESCRIPTION OF THE DRAWINGS

FIG. 6 illustrates a configuration of firmware in accordance with an embodiment of the present invention.

DETAILED DESCRIPTION

Figure 1:
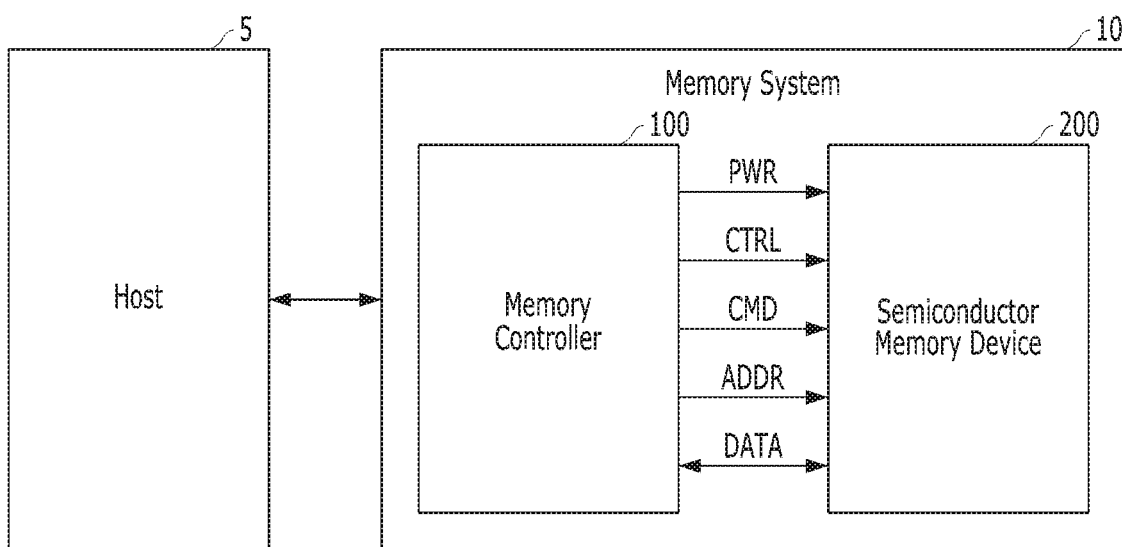
FIG. 1 is a block diagram illustrating a data processing system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
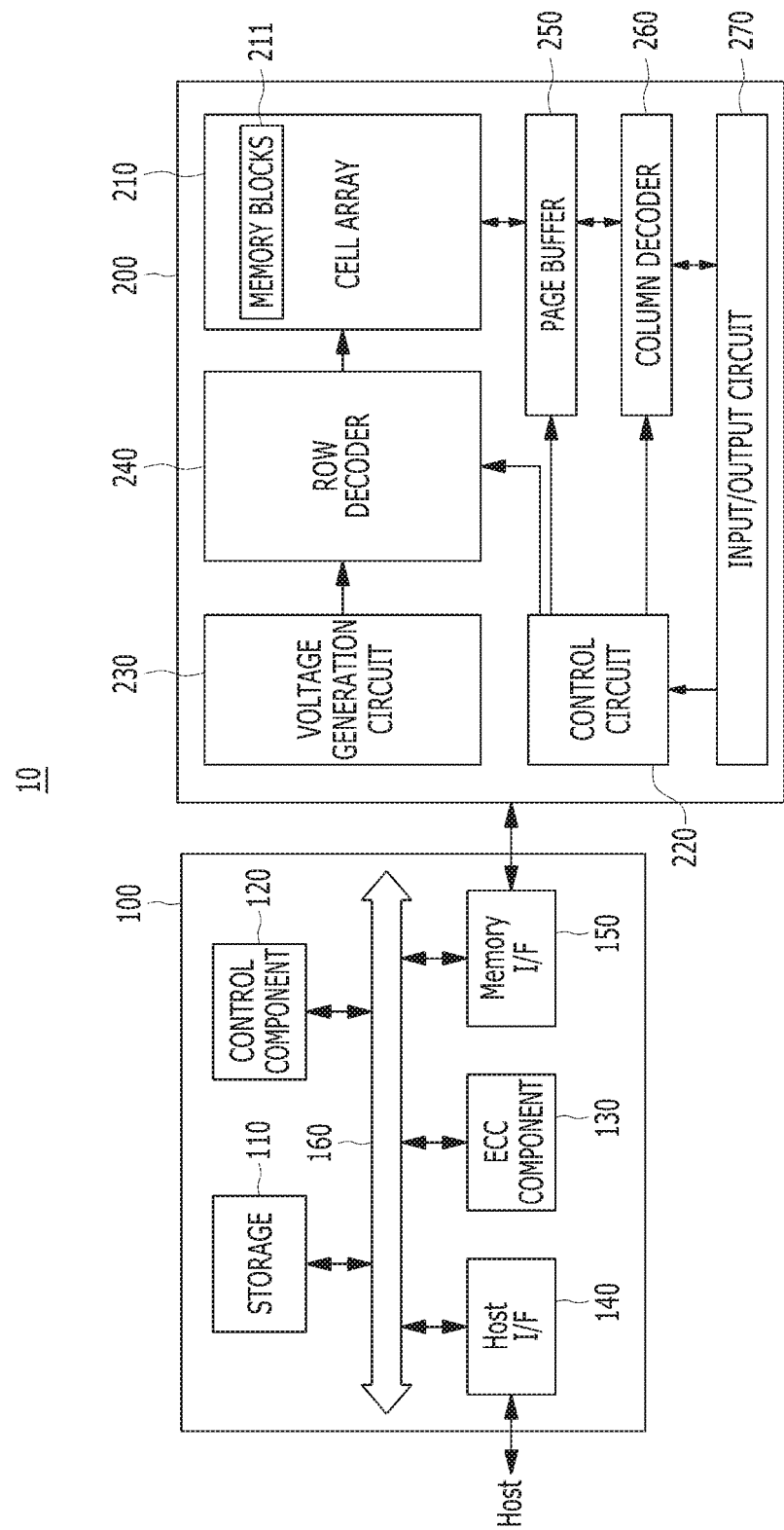
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
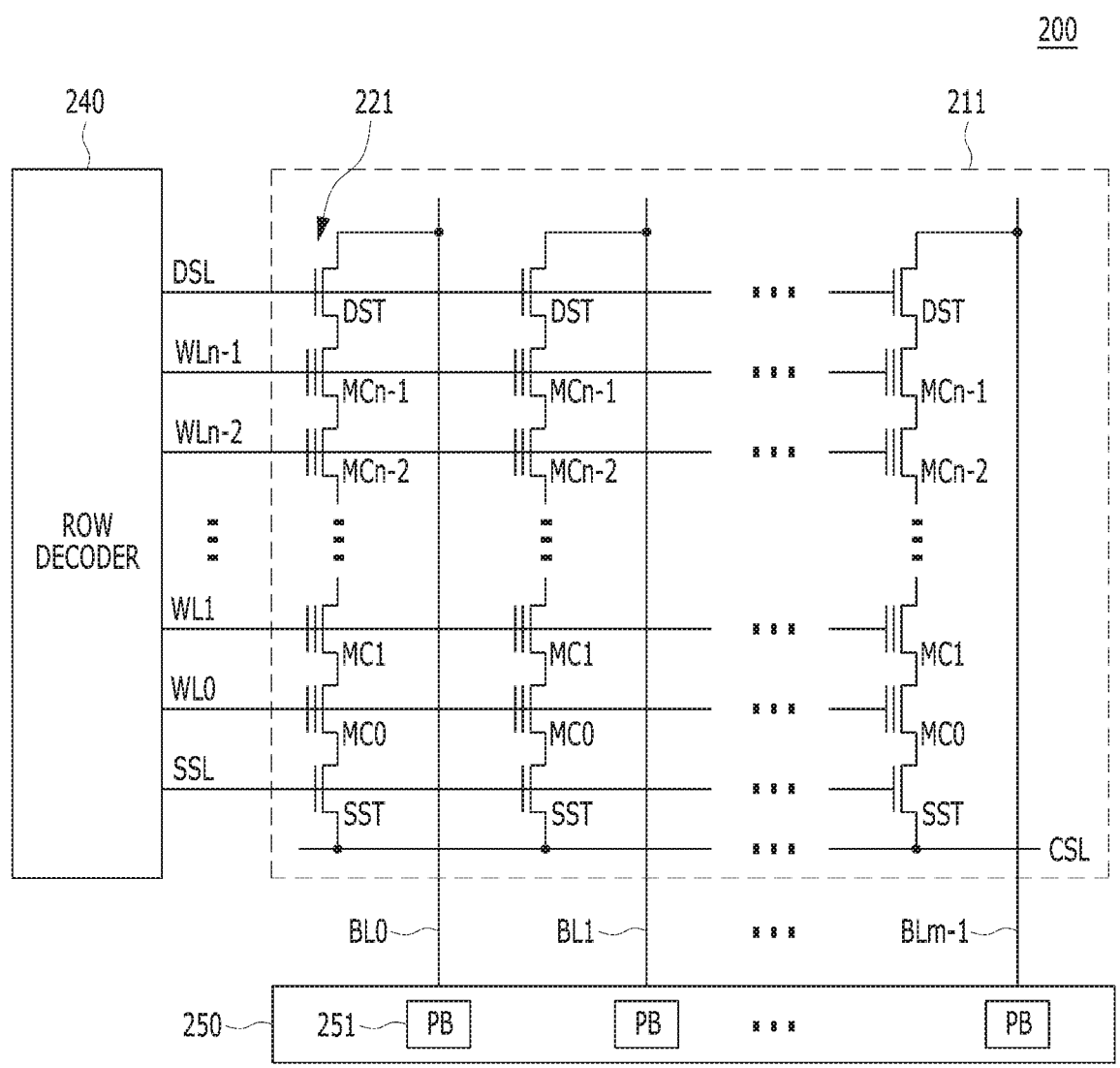
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data.

Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm-1. The page buffers 251 may operate in response to page buffer control signals. For example, the page buffers 251 my temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Memory systems operate on power, which is provided from an external device (e.g., a host device 5 of FIG. 1). For example, a memory system includes a power supply (e.g., a power management integrated circuit (PMIC)), which receives power from the external device and provides the power to internal components shown in FIG. 2. Users (or customers) may set certain power consumption limitations on the memory system itself and/or on individual components of the memory system. For example, in an SSD, a system-on-chip (SoC) (e.g., controller 100 of FIG. 2) typically consumes 10% to 15% of the total power of the SSD. In the SoC, an error correction code (ECC) module (or ECC IP) (e.g., ECC component 130 of FIG. 2) typically consumes 10% to 30% of power depending on the specific ECC IP or its product line. Further, users may measure power consumption thereof within a window of time. The size of the window may vary depending on particular use of the memory system or the ECC IP component. Developing one ECC IP to support different product lines and different users is challenging. Accordingly, it is desirable to provide a power control scheme and a memory system including a single ECC IP that can meet the power requirements for all product lines and users without losing performance and quality of service (QoS).

Figure 4:
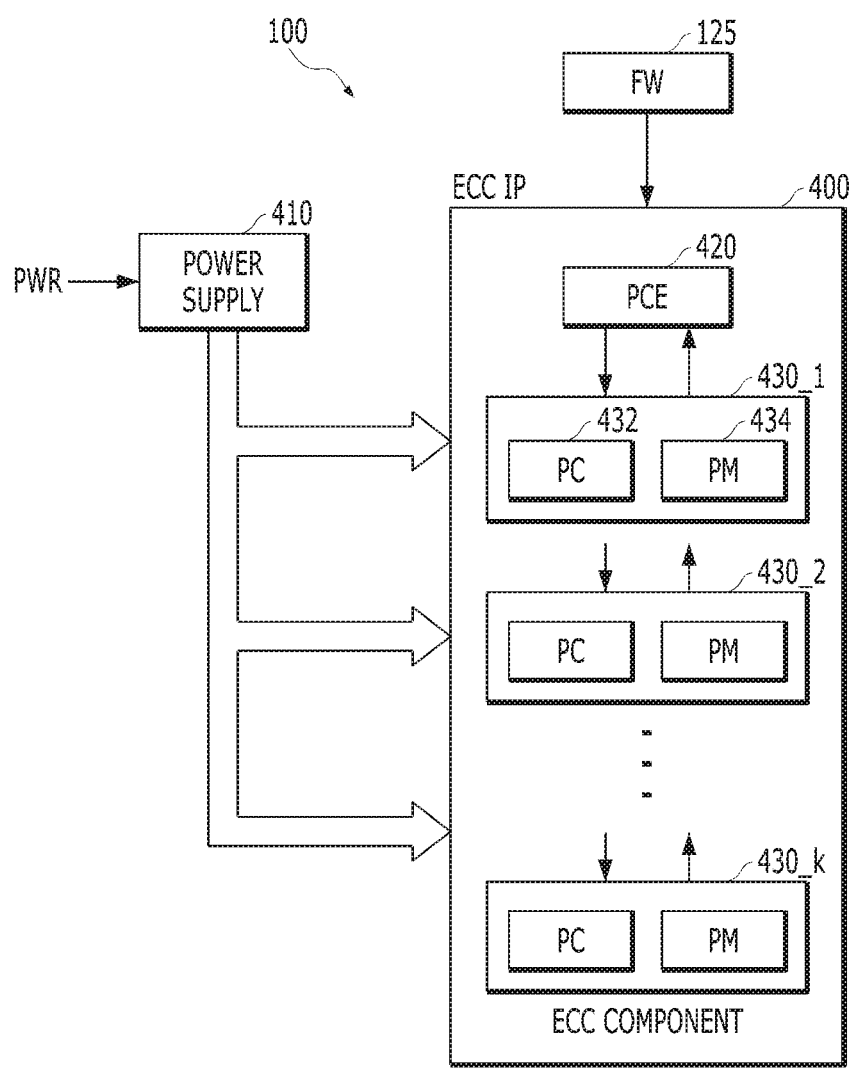
FIG. 4 is a diagram illustrating a controller in accordance with an embodiment of the present invention.

FIG. 4 is a diagram illustrating a controller 100 in accordance with an embodiment of the present invention. For example, the controller of FIG. 4 may depict the controller 100 shown in FIG. 2.

Referring to FIG. 4, the controller 100 may include firmware (FW) 125, an error correction code (ECC) module (i.e., ECC IP) 400 and a power supply 410. The power supply 410 may be a power management integrated circuit (PMIC), which receives power from the external device and provides or distributes the power to internal components of the controller 100. The firmware 125 may be included in the control component 120 of FIG. 2. The ECC module 400 may include a power control engine (PCE) 420 and a plurality of ECC components 430_1 to 430_k. The power supply 410 may receive power PWR from an external device (e.g., host device 5 of FIG. 2) and provide the plurality of ECC components 430_1 to 430_k with the power PWR.

Figure 5:
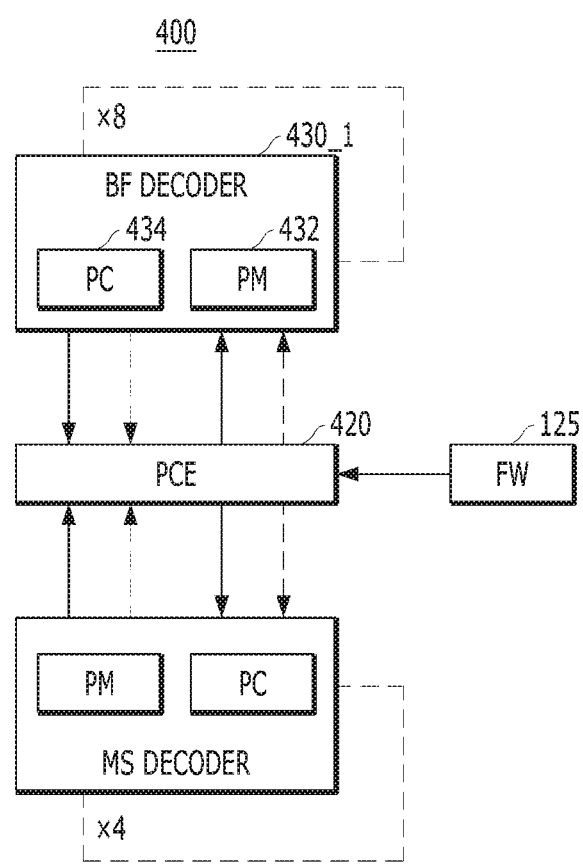
FIG. 5 is a diagram illustrating an example of a controller in accordance with an embodiment of the present invention.

Each of the plurality of ECC components 430_1 to 430_k may be provided with power PWR for operation. In some embodiments, each of the plurality of ECC components 430_1 to 430_k includes a decoder to detect and correct errors in data read from the memory device 200 of FIGS. 1 and 2. For example, as shown in FIG. 5, the ECC module 400 includes 8 bit-flipping (BF) decoders and 4 min-sum (MS) decoders as the plurality of ECC components 430_1 to 430_k.

Each of the plurality of ECC components 430_1 to 430_k may include a power controller (PC) 432 and a power monitor (PM) 434. For example, as shown in FIG. 5, the BF decoder 430_1 includes the power controller 432 and the power monitor 434. The power monitor 434 may measure power consumption of a corresponding ECC component (e.g., 430_1) within a window of time under the control of the power controller 432. The power controller 432 may control the power monitor 434 to perform the measurement within the window. Further, the power controller 432 may control the ECC component 430_1 to operate at a specific power level, which is determined by the power control engine 420.

The firmware 125 may configure a window of time for measuring power and a target power consumption rate for each ECC component. In some embodiments, the firmware 125 configures the target power consumption rate of the ECC component 430_1 depending on the product line of the memory system of ECC component 430_1. As a particular product line of memory systems develops, the power consumption rate required for individual memory systems in the product line, as well as ECC components thereof, may vary. For example, as shown in (620) of FIG. 6, among three memory systems within a given product line, the firmware 125 configures the power consumption rate as 10% relative to a maximum power of SSD for SSD100, the power consumption rate as 20°/o relative to a maximum power of SSD for SSD200 and the power consumption rate as 30% relative to a maximum power of SSD for SSD300.

In some embodiments, the firmware 125 configures the size of the window depending on a user (or a customer) of a memory system (e.g., an SSD). Different users may require different window sizes. In other words, different enterprise and data center customers may use different window size based on the peak and average power draw supported by their power supply units and rack configurations as well energy costs. For example, as shown in (610) of FIG. 6, the firmware 125 configures the size x of the window as 10 microseconds (µs) for user A, the size x of the window as 1 µs for user B and the size x of the window as 1 millisecond (ms) for user C. Embodiments allow the firmware 125 to configure SSD 300 based on the requirements of each customer without requiring any hardware modification.

Figure 7:
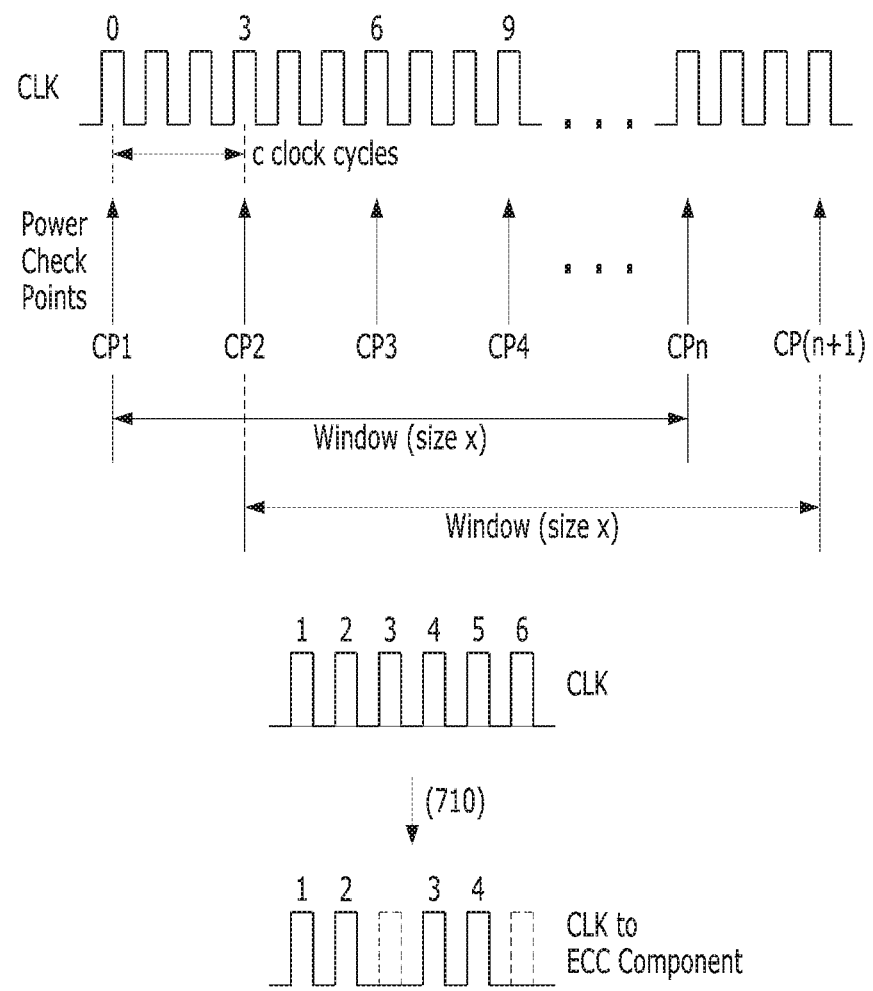
FIG. 7 illustrates a window of time for power measurement in accordance with an embodiment of the present invention.

Referring to FIG. 7, the size x of the window may be configurable by the firmware 125 of FIG. 4. The window may be configured to include a plurality of power check points, for example, n power check points CP1 to CPn. Adjacent power check points may be spaced apart in time by a set number of clock cycles, for example, c clock cycles (where c=3). In some embodiments, c may be determined by the user based on the intended use of the memory system(s)

and/or power consumption rates required for memory system(s) of a particular product line.

Further, the number of clock cycles, for example, c clock cycles, may be adjusted to reduce power consumption of the ECC component 430_1. The power consumed by the ECC component 430_1 can be divided into switching power and leakage power. Leakage power is consumed as long as transistors of the ECC component 430_1 are powered. Switching power is consumed whenever the state of each transistor changes. For an active ECC component 430_1 with many states toggling, the switching power is the majority contributor to the total power consumption of the ECC component 430_1. If the number of clock cycles in the window is reduced, the power consumption of the ECC component 430_1 is reduced. This reduction in the number of clock cycles is achieved by gating (or removing) at least one partial clocks of the clock cycles in the window. For this reduction, the power control engine 420 may transmit T and t values to the power controller 432 at every power check point, and the power controller 432 may gate t clock cycles in every T clock cycles (e.g., T is equal to c in FIG. 7). For example, 1 clock cycle in every 3 clock cycles is gated such that the number of clock cycles between two power check points become 2, as shown in (710) of FIG. 7.

Referring back to FIG. 4, the power monitor 434 may monitor the power consumption of the ECC component 430_1 within a window of size x. For monitoring, at every c clock cycles (i.e., each power check point), the power monitor 434 may check a state of the ECC component 430_1. The ECC component 430_1 may have 2 states: an active state and an idle state. Further, the power monitor 434 may check the power level of the ECC component 430_1. Thus, the power monitor 434 may measure power of the ECC component 430_1 at each power check point.

At each power check point, the power monitor 434 may report the power measurement to the power control engine 420. Thus, power consumption within the window may be monitored by accumulating the power measured at each of the power check points within the window. Further, the power measurement obtained at each power check point may be stored in a first-in, first-out (FIFO) buffer as shown in FIG. 8.

Figure 8:
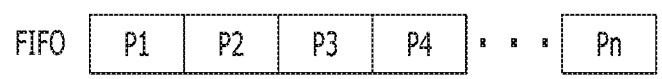
FIG. 8 illustrates a first-in, first-out (FIFO) buffer in accordance with an embodiment of the present invention.

Referring to FIGS. 7 and 8, at the power check point CP1, the power monitor 434 may measure power P1 of the ECC component 430_1 and store the measured power P1 in the FIFO buffer. At the power check point CP2, the power monitor 434 may measure power P2 of the ECC component 430_1 and store the measured power P2 in the FIFO buffer. At the power check point CP3, the power monitor 434 may measure power P3 of the ECC component 430_1 and store the measured power P3 in the FIFO buffer. At the power check point CP4, the power monitor 434 may measure power P4 of the ECC component 430_1 and store the measured power P4 in the FIFO buffer. At the power check point CPn, the power monitor 434 may measure power Pn of the ECC component 430_1 and store the measured power Pn in the FIFO buffer. When power is measured at an (n+1) power check point, the oldest measurement (e.g., P1) is evicted and the new power measurement P(n+1) may be stored in the FIFO buffer. Thus, Pn represents the power being consumed by ECC component 430_1 at power check point CPn.

Referring back to FIG. 4, the power control engine 434 may receive power measurements from each of the ECC components 430_1 to 430_k, and determine power consumption of a certain ECC component (e.g., ECC component 430_1) within a moving time window by accumulating or adding the power values measured at the respective power check points within the window. For example, the power control engine 434 receives a power measurement at power check point CPn, accumulates the power measurements within a window from power check point CP1 to the power check point CPn and determines the total power consumption of the ECC component 430_1 within the window. For another example, the power control engine 434 receives a power measurement at power check point CP(n+1), accumulates the power measurements within a window from power check point CP2 to power check point CP(n+1) and determines the total power consumption of the ECC component 430_1 within the window. As such, the power control engine 434 may determine which among all moving windows of size x the power consumption was greatest and determine that window to represent the peak power of ECC component 430_1. Further, the power control engine 420 may decide a next power level for the ECC component 430_1, and control the ECC component 430_1 such that the ECC component 430_1 operates at the decided next power level. In other words, the power control engine 420 may decide whether or not to change the current power level for the ECC component 430_1. In some embodiments, the power control engine 420 may decide the next power level for the ECC component 430_1, based on power measurements accumulated within the window or based on an average of the accumulated power measurements within the window. In some embodiments, the next power level may be a percentage of the maximum peak power for the ECC component 430_1, i.e., 10%, 20%, . . . , 100% of the maximum peak power of the ECC component 430_1.

The power control engine 434 may support 3 power control modes including mode 0 (i.e., a disabled mode), mode 1 (i.e., a separate power control mode) and mode 2 (i.e., a joint power control mode). The firmware 125 may determine the power modes for the respective ECC components. The firmware 125 may set each of the ECC components to the same power mode.

In mode 0, the power control engine 434, the power controller 432 and the power monitor 434 may be disabled so that the ECC IP 400 provides maximum performance without consideration for controlling power. In other words, the plurality of ECC components 430_1 to 430_k are enabled, but no power control is applied to any of them.

In mode 1, the power control engine 420 may set the maximum peak power for each ECC component independently. The power control engine 420 may run separate finite state machines (FSMs) for each ECC component to decide a next power level for the corresponding ECC component independently, as shown in (910) of FIG. 9. In (910) of FIG. 9, k FSMs may correspond to k ECC components, respectively. In mode 1, high power consumption in one ECC component only leads to reduction in power level for this ECC component and other components are not affected. This mode may be used in a drive where multi-tenancy is expected (e.g., multiple users using the drive in a virtualized scenario like a data center) to separate effect of high workload from one user negatively affecting the performance of other users.

By way of example, the power control engine 420 receives the power measurement of the ECC component 430_1 at each power check point. After the power has been measured n times at n power check points, the power control engine 420 calculates a total accumulated power and an average power within the window based on the n power measurements. The total accumulated power of the ECC component 430_1 in the time window defined by the times of the first and last power measurements is calculated as $P=Sum(p\_i)$, where p_i is the power at the i-th power check point. The average power is calculated as $P=Sum(p\_i)/n$, where n is the number of power check points within the window. The power control engine 420 may decide a next power level for the ECC component 430_1, based on the total accumulated power or the average power.

Figure 9:
FIG. 9 illustrates finite state machines (FSMs) in accordance with an embodiment of the present invention.
Figure 9:
Figure 9:
Figure 9:
Figure 9:

In mode 2, the power control engine 434 may run a joint FSM for all ECC components 430_1 to 430_k, as shown in (920) of FIG. 9. The power control engine 434 may receive power measurements from all ECC components 430_1 to 430_k, calculate a total accumulated power or an average power of all ECC components 430_1 to 430_k within a window and decide a next power level for each ECC component, based on the total accumulated power or the average power. In mode 2, when power consumption combined over all ECC components is high within a window, the power control engine 434 may decide to run non-critical ECC components with reduced power level till the next checkpoint. The FSM for joint power control may be designed to keep latency low on most read operations by distributing power budget to critical ECC components, and also to avoid starvation by allowing some power budget to non-critical ECC components in a round-robin fashion to maintain overall QoS.

After deciding a next power level for each ECC component, the power control engine 434 may transmit a power control action signal to the power controller 432 of each ECC component. The power control action signal may include information indicating a next power level of each ECC component.

The power controller 432 may receive the power control action signal from the power control engine 434. For example, the power control action signal may be received from the power control engine 434 at each power check point. The power controller 432 may control the ECC component 430_1 to operate at the next power level in response to the power control action signal. In some embodiments, the next power level may be a percentage of the maximum peak power for the ECC component 430_1 i.e., 10%, 20%, . . . , 100% of the maximum peak power of the ECC component 430_1.

Further, the power controller 432 may gate t clock cycles in every T clock cycles to reduce power consumption of the ECC component. T and t are values that the power control engine 420 transmits to the power controller 432 at every power check point.

Figure 10:
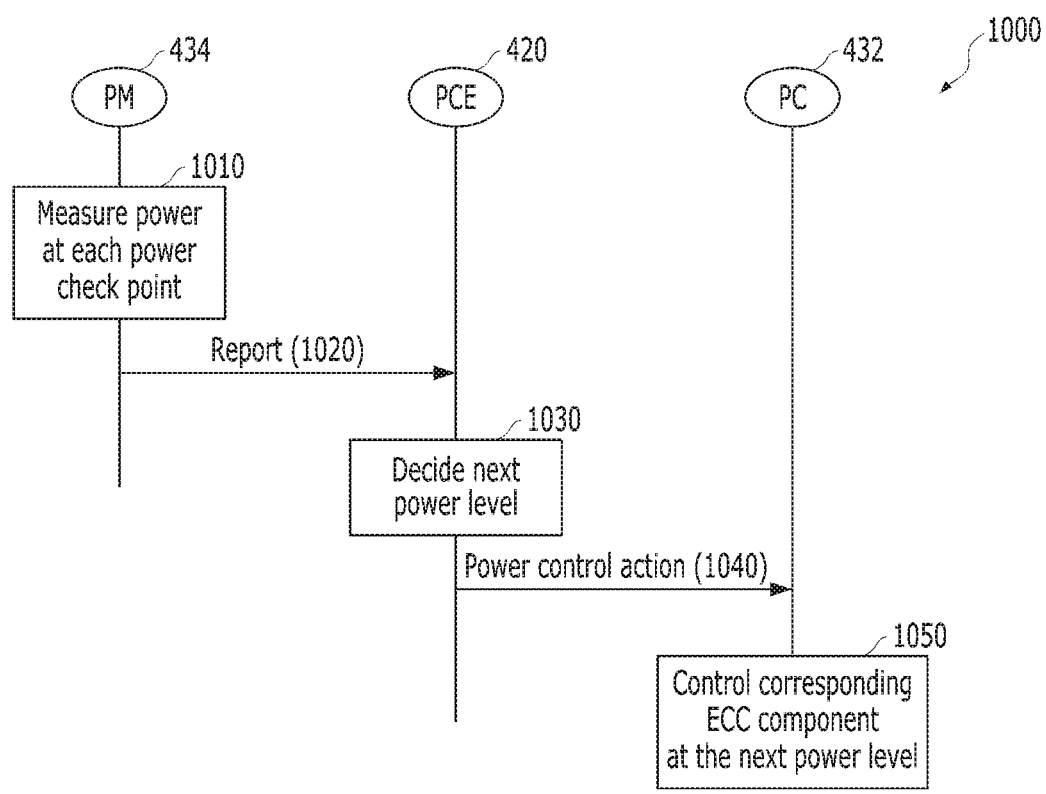
FIG. 10 illustrates an operation of a controller in accordance with an embodiment of the present invention.

FIG. 10 illustrates an operation 1000 of a controller in accordance with an embodiment of the present invention. The operation 1000 may be performed by components 420, 432 and 434 of the controller 100 in FIG. 4.

Referring to FIG. 10, the operation 1000 may include steps 1010 to 1050. At step 1010, the power monitor 434 measures power of the ECC component 430_1 at each power check point in a window of time under the control of the power controller 432. At step 1020, the power monitor 434 reports the power measurement of the ECC component 430_1 to the power control engine 420.

At step 1030, the power control engine 420 receives the power measurement from the power monitor 434. When n power measurements taken at n power check points respectively within the window are received, the power control engine 420 decides a next power level for the ECC component 430_1, i.e., whether to change the current power level, based on an accumulation or an average of the power measurements. The next power level is then set. In an embodiment, the power control engine 420 decides the next power level for the ECC component 430_1, based on the power measurements from the power monitor 434 of the ECC component 430_1. In another embodiment, the power control engine 420 decides the next power level for the ECC component 430_1 based on the power measurements from all power monitors of all ECC components 430_1 to 430_k, respectively.

At step 1040, the power control engine 420 generates a power control action signal indicating the next power level and transmits the power control action signal to the power controller 432.

At step 1050, the power controller 432 receives the power control action signal from the power control engine 420. Further, the power controller 432 controls the ECC component 430_1 to operate at the next power level according to the power control action signal.

As described above, embodiments may control power of each ECC component in an ECC IP using components such as a power control engine, a power controller and a power monitor, which are configured by firmware. Thus, power control according to embodiments supports different systems of different product lines, as well as different customers' needs without hardware change.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A controller of a memory system comprising:
a plurality of error correction code (ECC) components, each ECC component including a power monitor and a power controller;
a power control engine; and
firmware suitable for configuring a window of time and a power consumption rate of a select ECC component among the plurality of ECC components depending on characteristics of the memory system,
wherein the power monitor of the select ECC component measures power consumption of the select ECC component within the window under the control of the power controller of the select ECC component; and
wherein the power control engine
receives the measurement of power consumption from the power monitor,
decides a next power level for the select ECC component based on the measurement of power consumption, and
controls the power controller of the select ECC component such that the select ECC component operates at the next power level.

2. The controller of claim 1, wherein the firmware configures the window of time based on intended use of the memory system,
and the firmware configures the power consumption rate of the select ECC component based on a configuration of the memory system.

3. The controller of claim 1, wherein the window includes a plurality of power check points.

4. The controller of claim 3, wherein each power check point corresponds to multiple clock cycles.

5. The controller of claim 3, wherein the power monitor measures the power consumption of the select ECC component based on a state of the select ECC component, and the state includes an active state or an idle state.

6. The controller of claim 3, wherein the power monitor measures power of the select ECC component at each power check point.

7. The controller of claim 6, wherein the power monitor stores the power measurements in a first-in, first-out (FIFO) buffer.

8. The controller of claim 6, wherein the power control engine receives the power measurements from the power monitor of the select ECC component, and decides a power level for the select ECC component at a next power check point, based on the received power measurements.

9. The controller of claim 6, wherein the power control engine receives power measurements from power monitors of the plurality of ECC components, and decides a next power level for each of the ECC components at a next power check point, based on the corresponding power measurements.

10. The controller of claim 1, wherein each ECC component includes a decoder.

11. A method for operating a controller of a memory system including firmware, a power control engine and a plurality of error correction code (ECC) components, each ECC component including a power monitor and a power controller, the method comprising:

configuring, by the firmware, a window of time and a power consumption rate of a select ECC component among the plurality of ECC components depending on characteristics of the memory system;

measuring, by the power monitor of the select ECC component, power consumption of the select ECC component within the window under the control of the power controller of the select ECC component;

controlling, by the power control engine, the power controller such that the power monitor performs the measurement within the window;

receiving, by the power control engine, the measurement of power consumption from the power monitor;

deciding, by the power control engine, a next power level for the corresponding ECC component based on the measurement of the power consumption; and controlling, by the power control engine, the power controller such that the select ECC component operates at the next power level.

12. The method of claim 11, wherein the configuring includes configuring the window of time based on intended use of the memory system, and configuring the power consumption rate of the select ECC component based on a configuration of the memory system.

13. The method of claim 11, wherein the window includes a plurality of power check points.

14. The method of claim 13, wherein each power check point corresponds to multiple clock cycles.

15. The method of claim 13, wherein the measuring includes measuring the power consumption of the select ECC component based on a state of the select ECC component, and the state includes an active state or an idle state.

16. The method of claim 13, wherein the measuring includes measuring power of the select ECC component at each power check point.

17. The method of claim 16, further comprising storing, by the power monitor, the power measurements in a first-in, first-out (FIFO) buffer.

18. The method of claim 16, wherein the receiving includes receiving the power measurements from the power monitor of the select ECC component, and wherein the deciding includes deciding a power level for the select ECC component at a next power check point, based on the received power measurements.

19. The method of claim 16, wherein the receiving includes receiving power measurements from power monitors of the plurality of ECC components, and wherein the deciding includes deciding a next power level for each of the ECC components at a next power check point, based on the corresponding power measurements.

20. The method of claim 11, wherein each ECC component includes a decoder.

* * * * *